(12) United States Patent
Boynapalli et al.

(10) Patent No.: US 9,230,691 B1
(45) Date of Patent: Jan. 5, 2016

(54) SHARED REPAIR REGISTER FOR MEMORY REDUNDANCY

(71) Applicant: QUALCOMM Incorporated, San Diego, CA (US)

(72) Inventors: Venugopal Boynapalli, San Marcos, CA (US); Bilal Zafar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/535,097

(22) Filed: Nov. 6, 2014

(51) Int. Cl.
*G11C 29/00* (2006.01)
*G11C 11/419* (2006.01)

(52) U.S. Cl.
CPC .............. *G11C 29/70* (2013.01); *G11C 11/419* (2013.01)

(58) Field of Classification Search
USPC ................... 365/200, 189.02, 189.16, 189.12
See application file for complete search history.

(56) References Cited

U.S. PATENT DOCUMENTS

| | | | |
|---|---|---|---|
| 6,006,311 A | * | 12/1999 | Arimilli ................ G06F 12/126 365/200 |
| 7,284,166 B2 | | 10/2007 | Zappa et al. |
| 7,757,135 B2 | | 7/2010 | Nadeau-Dostie et al. |
| 8,117,498 B1 | | 2/2012 | Wood et al. |
| 2009/0248955 A1 | | 10/2009 | Tamada |

OTHER PUBLICATIONS

Tseng T.W., et al., "ReBISR: A Reconfigurable Built-In Self-Repair Scheme for Random Access Memories in SOCs," IEEE Transactions on Very Large Scale Integration (VLSI) Systems, Jun. 2010, vol. 18 (6), pp. 921-932.

* cited by examiner

*Primary Examiner* — Vu Le
(74) *Attorney, Agent, or Firm* — Haynes and Boone, LLP

(57) ABSTRACT

A cross-bar switch is provided that enables each master from a plurality of masters to read from and write to selected memories from an array of memories. A logic circuit controls the cross-bar switch so that redundancy for the memories is provided by a shared redundancy storage element.

27 Claims, 3 Drawing Sheets

SHARED REPAIR REGISTER FOR MEMORY REDUNDANCY

TECHNICAL FIELD

This application relates to integrated circuit memories, and more particularly to a shared repair register for memory redundancy.

BACKGROUND

In conventional memory redundancy, each memory includes one or more redundant features. For example, a memory with column redundancy will include a redundant column that may be used to replace the function of a defective column. Although such conventional redundancy techniques are quite effective to address memory defects, a modern system on a chip (SOC) will typically include numerous embedded memories.

If each embedded memory in an SOC implements conventional column redundancy, the SOC needs some way to store the defective column address (the column redundancy address) for any of the defective memories. A priori, one doesn't know whether a given memory has a defect so the SOC must then dedicate storage space for each memory with regard to its potential redundancy address. For example, if each memory has 128 columns then the corresponding redundancy addresses are each 7-bit words. If the SOC has 1000 embedded memories, it would then need a 7K bit memory to store the redundancy information. Such a relatively large memory demands excessive die area.

But it would virtually never be the case that each embedded memory has a defect. More typically, only a few (or less) of all the embedded memories in each SOC would be defective. For this reason, the fuses may be shared by all the embedded memories. For example, if the SOC is to have the ability to repair just one embedded memory, then the SOC would need just a few fuses as the resulting stored redundancy address would be shared by all the embedded memories.

Although fuse sharing thus advantageously offers considerable die savings over conventional dedicated redundancy addressing schemes, the embedded memories themselves become inefficient with regard to their die space usage. In particular, each embedded memory would include the circuitry for implementing redundancy yet at most a few of the embedded memories would ever use this circuitry. Indeed, as the number of embedded memories is increased, the vast majority of them would have their redundancy circuitry lie fallow and thus waste die space.

Accordingly, there is a need in the art for denser memory redundancy architectures and techniques.

SUMMARY

A cross-bar switch is provided that enables a plurality of masters to write to selected memories from an array of memories. Similarly, the cross-bar switch allows each master to read from selected memories from the array. An arbitration logic circuit controls the cross-bar switch and arbitrates any write conflicts that could arise from multiple masters attempting to write to or read from the same memory.

Should one of the memories have a faulty storage location such as a faulty row or column, the arbitration logic circuit also determines whether any of the masters is attempting to write to the faulty storage location. If such a write attempt occurs from one of the masters, the arbitration logic switch controls the cross-bar switch so that the corresponding data word from the master is written to a repair register. Similarly, the arbitration logic circuit determines if any of the masters is attempting to read from the faulty storage location and instead reads from the storage location so that the correct data word is provided to the master attempting to read from the faulty storage location.

Since the repair register replaces the function of the faulty storage location, none of the memories needs to include any redundancy features such as a redundant row or column. This is quite advantageous in that density is markedly enhanced over conventional redundant row or column memory architectures. These features may be better appreciated from the following detailed description of example embodiments.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
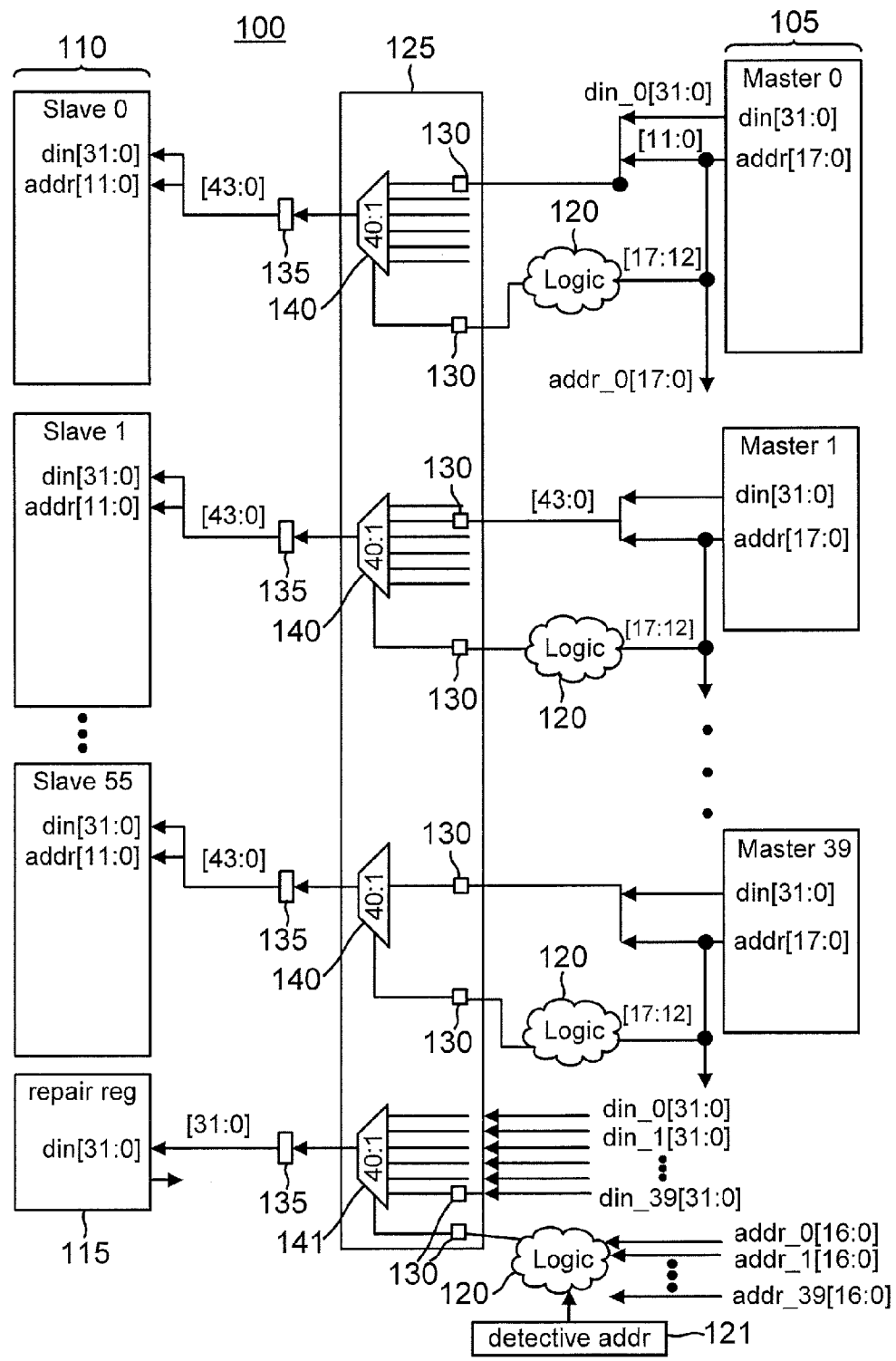
FIG. 1 is a circuit diagram of the write paths in an integrated circuit from a plurality of masters through a cross-bar switch to an array of embedded memories and a repair register in accordance with an embodiment of the disclosure.

In an integrated circuit such as an SOC, assorted different processes may need to read or write from a number of different memories embedded within the SOC. The following discussion refers to the processes needing memory access as "masters." For example, each master may comprise a logic circuit such as an arithmetic logic unit (ALU). Alternatively, a master may comprise an individual processor or other logic element that requires read access and write access to the embedded memories. It is conventional to use a cross-bar switch to enable any master from an array of masters to read from or write to any memory from an array of memories. For example, the cross-bar switch may include a write multiplexer for each memory. Each memory's write multiplexer in the cross-bar switch may select from write addresses and corresponding data words from the masters and provide the selected write address and corresponding data word to the memory. For example, suppose an SOC has twenty embedded memories and ten masters. The cross-bar switch may then have twenty write multiplexers corresponding to the twenty embedded memories. Each write multiplexer in such an embodiment would then select a write address and corresponding data word from the ten masters such that each write multiplexer would be a 10:1 multiplexer. Similarly, the cross-bar switch may include a read multiplexer for each master. Each read multiplexer selects from the data output words from each embedded memory to select the appropriate data word for its master. In the example embodiment having twenty embedded memories, each read multiplexer may thus be a 20:1 multiplexer.

Since each master is free to select any particular memory for a read or write operation through the cross-bar switch, there is the possibility that masters may issue conflicting read or write commands. For example, one of the masters may desire to write to one of the memories while at the same time another one of the masters is trying to write to the same memory. The corresponding write multiplexer would then have a conflict as to which write address/data word combination it should select from the two masters. It is thus conventional for the cross-bar switch to associate with an arbitration logic circuit that arbitrates any conflicting demands from the masters before carrying out the desired read or write operation.

As discussed above, the combination of a cross-bar switch and an arbitration logic circuit is known. The memory redundancy architectures and techniques disclosed herein advantageously exploits this combination of a cross-bar switch and its arbitration logic circuit to achieve memory redundancy with markedly improved density and reduced complexity. For example, none of the embedded memories need any redundant features. In lieu of having redundant features such as a redundant row or column in each embedded memory, a shared redundancy storage element such as a "repair" register is provided that is shared by the memories. This repair register may be used to replace a defective column or row in a defective one of the memories. In general, it is just one bit that will be defective in any defective memory. Accordingly, it doesn't matter whether the row including that defective bit is replaced or instead the column including that defective bit is replaced by the repair register. Because of this equivalence, the following example embodiments will be directed to a repair register for replacing defective rows since this is easier to implement in that the memories are addressed a word at a time, which corresponds to addressing a particular row. The repair register would thus have the same width in bits as the rows in the memories. It will be appreciated, however, that a repair register that replaces a defective column may be implemented in alternative embodiments.

The cross-bar switches disclosed herein include a repair register write multiplexer for the repair register. In addition, each write multiplexer may not only select from the data output word from each embedded memory but also from a data output word stored in the repair register. Upon manufacture, an integrated circuit including the array of embedded memories is tested to determine the identity (if present) of the defective memory and the defective storage location within the defective memory. This defective storage location may be either the column address or row address for the defective storage cell within the defective memory. The combination of the defective memory address and the address of its defective storage location may be denoted more succinctly herein as a "defective address." Similarly, the combination of a memory address and the address for the storage location in the addressed memory as generated by a master in a write operation may be denoted herein as a "write address." This same address combination in a read operation is denoted herein as a "read address." In a write operation, the arbitration logic circuit proceeds to control the write multiplexer for the addressed memory to select for the storage location address and corresponding data word from the generating master even if that storage location address in the addressed memory is defective. In that regard, the arbitration logic circuit functions as it conventionally does with regard to writing to the memories regardless of whether the write address matches the defective address.

To accommodate the memory defect, the arbitration logic circuit also controls the repair register write multiplexer. To do so, the arbitration logic circuit compares the write address from any master initiating a write operation to the defective address. In that regard, each master may or may not be active at any given time with regard to initiating a write or read operation. The arbitration logic circuit may thus be comparing the write address from all the masters (should they all be active in a write operation) or only for the subset of masters that are currently active in a write operation. If none of the write addresses match the defective address, the arbitration logic circuit controls the repair register write multiplexer to select for none of the available data words from the active masters. However, if a write address matches the defective address, the arbitration logic circuit controls the repair register write multiplexer to select for the output data word from the originating master. For example, suppose that the first row in a third one of the embedded memories is defective. In a write operation to this row, the write multiplexer for the third embedded memory operates as it would do if there were no errors in that it selects for the corresponding data word from the originating master for writing into the defective row. Since the row is defective, the write operation is also defective but such error is harmless in that the same data word is also written into the repair register through the repair register write multiplexer.

A read operation through the cross-bar switch is analogous in that the read multiplexer for each master is controlled by the arbitration logic circuit. If the read address matches the defective address, the arbitration logic circuit controls the master's read multiplexer to select for the stored data word in the repair register. If the read address does not match the defective address for an active master, the arbitration logic circuit controls that master's read multiplexer in a conventional fashion. Some example embodiments will now be discussed in more detail.

Turning now to the drawings, FIG. 1 illustrates an integrated circuit 100 including an array of masters 105 that read from and write to an array of slave embedded memories 110 (which will be referred to simply as memories 110 for brevity herein) through a cross-bar switch 125. Cross-bar switch 125 also enables each master 105 to read and write from a repair register 115 as necessary. In one embodiment, cross-bar switch 125 may thus be deemed to comprise a means for coupling the masters to the memories so that each master can read from and write to selected ones of the memories. FIG. 1 focuses on just the write paths from masters 105 to memories 110 and repair register 115 for illustration clarity. The read paths will be discussed further below. To provide the write paths, cross-bar switch contains a plurality of N M:1 write multiplexers 140 for each memory 110, where M represents the number of masters 105 and N represents the number of memories 110. In integrated circuit 100, there are forty masters 105 so each write multiplexer is a 40:1 multiplexer 140. In addition, there are fifty-six memories 110 in integrated circuit 100, ranging from a zeroth memory (Slave 0) 110 to a $55^{th}$ (Slave 55) memory 110. Note that memories 110 may function without any redundancy features because repair register 115 acts as the replacement feature for the embedded memories. It is convenient for repair register 115 to replace a row in any of memories 110. Thus, the following discussion will be directed to a row replacement redundancy scheme but it will be appreciated that the same architecture is readily adapted for column redundancy as well.

In integrated circuit 100, each memory 110 has a sufficient number of rows such that their row (word) addresses are represented by 12-bit words. A given master 105 thus needs twelve address bits just to select the row it will write to in the selected memory 110. But each master 105 will also need sufficient address bits to select the appropriate memory 110 from the array. In integrated circuit 100, there are fifty-six memories 110 so that corresponds to six bits for addressing a particular one of them. The total write address generated by each master 105 is this a [12+6=18] bit word, represented by the variable addr[17:0]. The write address for the zeroth master 105 is represented by addr_0[17:0]. Similarly, the write address for the first master 105 is represented as addr_1 [17:0] and so on such that the write address for the 39$^{th}$ master is represented as addr_39[17:0]. All these write addresses (as generated by any of the active masters) are received by arbitration logic circuit 120 with regard to controlling a repair register write multiplexer 141 that writes to repair register 115. Repair register write multiplexer 141 may also be denoted as a redundancy write multiplexer. During a write operation, arbitration logic circuit 120 compares the various write addresses to a defective write address 121 that identifies the faulty memory and its faulty storage location. If there is a match of a write address from an active one of the masters 105 to defective write address 121, arbitration logic circuit 120 controls repair register write multiplexer 141 to write the data word corresponding to the matching address to repair register 115.

Write multiplexers 140 are controlled by arbitration logic circuit 120 in a conventional fashion. Each write address as discussed earlier is a combination of the storage location address bits for the selected memory (in this embodiment, a 12-bit row address) and the address bits for selecting a particular memory from the array of memories. In integrated circuit 100, there are fifty-six memories 110 so that requires another six bits to identify a particular one of the them. Each resulting write address is thus an 18-bit word in this embodiment (addr[17:0]). The twelve storage location address bits may be considered to range from [11:0] whereas the six address bits for selecting a particular memory may be considered to range from [17:12]. Arbitration logic circuit 120 may thus use the six-bit [17:12] portion of the write address from each active master 105 to control the selection at the write multiplexers 140 corresponding to the memories 110 selected for a particular write operation. The write multiplexer 140 for each memory 110 addressed in a write operation then selects for appropriate data input word and storage selection address from the active master 105. Each row in memories 110 is 32 bits wide such that the data input words (din) from each active master 105 are also 32 bits wide. For example, the data input word from the zeroth master 105 is denoted as din_0[31:0]. Similarly, the data input word from the first master 105 is denoted as din_1[31:0], and so on such that the data input word from the 39$^{th}$ master 105 is denoted as din_39[31:0].

Suppose that one of the memories 110 has a defective row. The corresponding 18-bit write address that identifies the faulty storage location and the faulty memory 110 may then be stored such as by burning fuses as represented by defective write address (defective addr) 121. Arbitration logic circuit 120 acts as a comparator to compare the defective write address 121 to the write addresses from the active masters 105 as discussed earlier. If there is a match, arbitration logic circuit 120 controls repair register write multiplexer 141 to select for the corresponding data input word from the forty possibilities (din_0[31:0] through din_39[31:0]). The corresponding data input word is then written into the repair register.

To provide a pipelining ability with regard to the write operations, the data input word din and the storage location address portion addr[11:0] from each master 105 may be registered in corresponding registers 130 prior to being processed through write multiplexers 140. Similarly, the decoded addresses from arbitration logic circuit 120 that controls each write multiplexer 140 may also be registered in corresponding registers 130 prior to controlling write multiplexers 140 accordingly. In addition, the outputs from each write multiplexer 140 (the 44-bit combination[43:0] of the 32-bit data input word and the 12-bit storage address location) may be registered in a set of registers 135 prior to providing these data input words and storage addresses to the corresponding memories 110. The resulting pipelining is such that in one clock cycle (or with respect to one clock edge), the registration occurs in registers 130. In the subsequent clock cycle (or the subsequent clock edge), the registration occurs in registers 135. In this fashion, any delay through write multiplexers 140 and the logic processing in arbitration logic circuit 120 is accommodated. In alternative embodiments, registers 130 and 135 may be omitted if the switching through cross-bar switch 125 and processing in arbitration logic circuit 120 is sufficiently fast as compared to the clocking speed.

Figure 2:
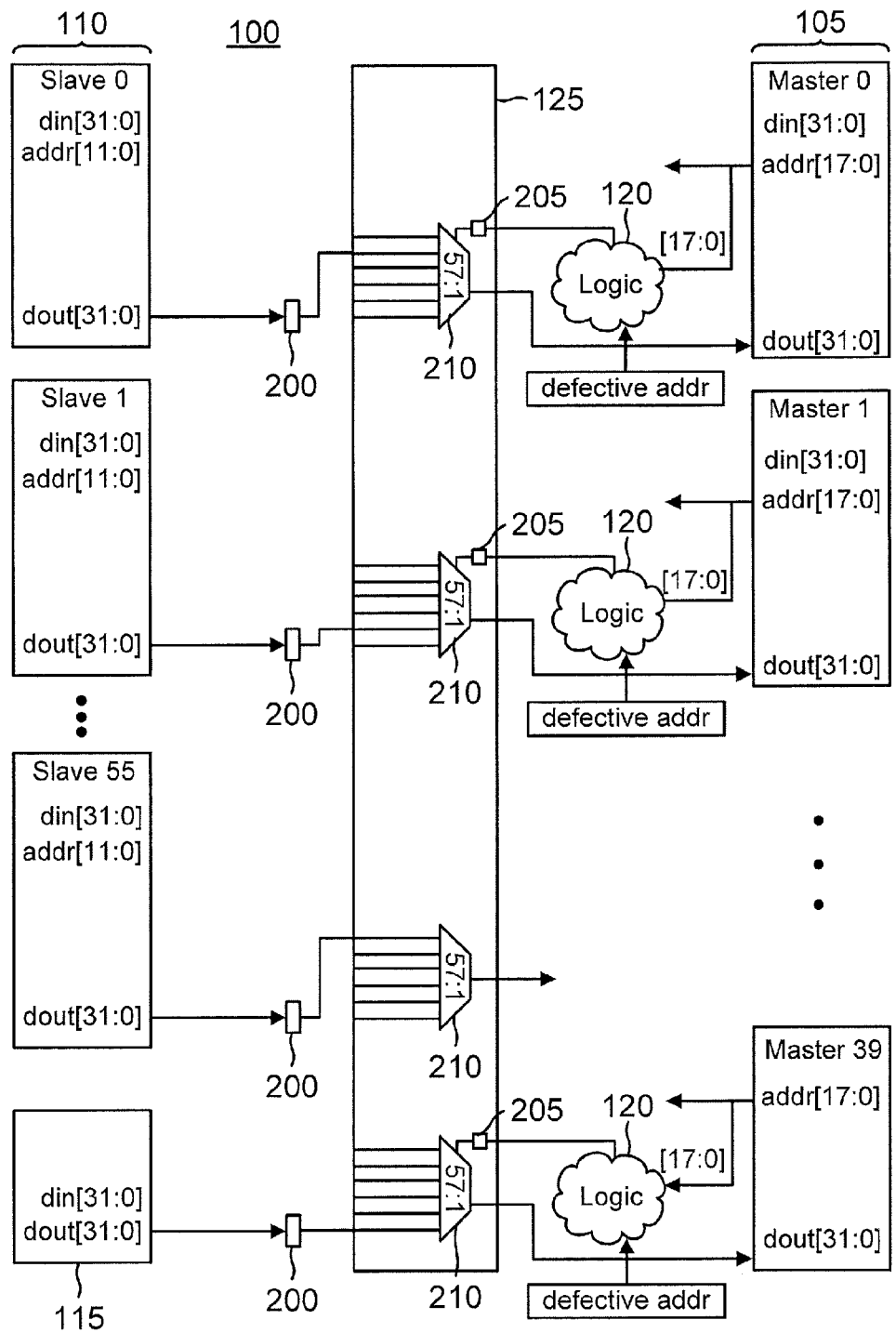
FIG. 2 is a circuit diagram of the read paths through the cross-bar switch of FIG. 1.

The read paths through cross-bar switch 125 are shown in FIG. 2. A read multiplexer 210 for each master 105 selects from the data output words (dout) from the various memories 110. In integrated circuit 100, there are fifty-six memories 110 so each master's read multiplexer 210 is configured to select from the corresponding fifty-six data output words from memories 110. In addition, each read multiplexer 210 may select for the data output word (dout) from repair register 115. Each read multiplexer 210 is thus a 57:1 multiplexer in integrated circuit 100.

Each active master 105 in a read operation provides a read address to arbitration logic circuit 120 to control its read multiplexer 210. The read address is analogous to the write address in that it identifies a particular memory and a storage location within the identified memory. In integrated circuit 100, each storage location address is a 12-bit row address. Identifying a particular memory requires 6 bits so each read address is thus an 18-bit address (addr[17:0]). Arbitration logic circuit 120 compares the read addresses from the active masters 105 to the defective address (defective addr). If a read address from a master 105 does not match the defective address, arbitration logic circuit 120 proceeds to control the corresponding read multiplexer 210 in a conventional fashion so as to select for the data output word from the addressed storage location in the addressed memory 110 so that the corresponding master 105 may receive the selected data output word. Conversely, if a read address from a particular master 105 matches the defective address, arbitration logic circuit 120 controls the particular master's read multiplexer 210 to select for the data output word from repair register 115.

The read paths through cross-bar switch 125 in FIG. 2 may be pipelined analogously as discussed with regard to the write paths of FIG. 1. For example, in one clock cycle (or clock edge), the control signals from the arbitration logic circuit 120 that control the selection by read multiplexers 210 may be registered in registers 205. In the same clock cycle (or clock edge), the retrieved data output words from memories 110 and (if necessary) from repair register 115 may be registered in registers 200. In a subsequent clock cycle, the outputs from read multiplexers 210 may be registered in corresponding registers (not illustrated). In this fashion, the resulting pipelining accommodates the delay in routing through cross-bar switch 125. Depending upon the data rate and the processing speed of cross-bar switch 125, such pipelining may not be necessary in alternate embodiments. An example method of operation for an integrated circuit including a shared redundancy storage location such as a repair register will now be discussed.

Figure 3:
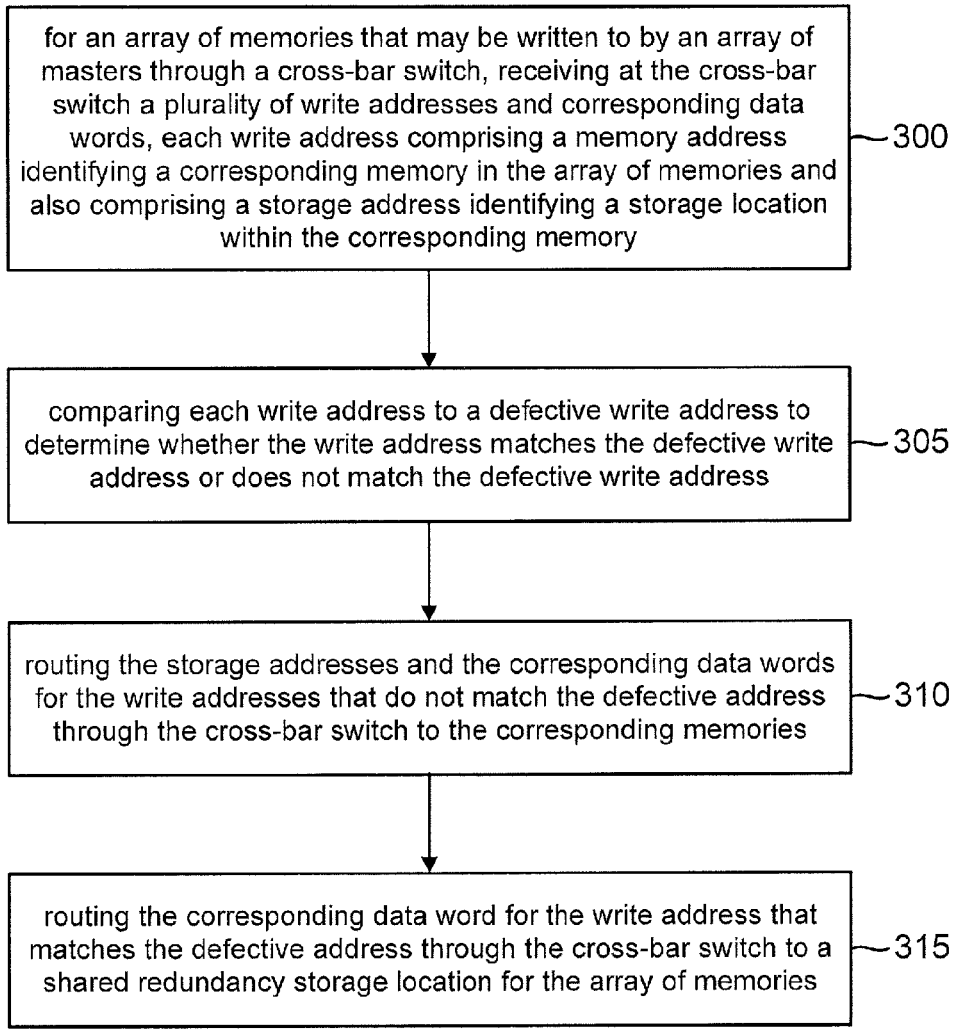
FIG. 3 is a flowchart for a method of operation of a cross-bar switch coupled to a repair register in accordance with an embodiment of the disclosure.

A flowchart for a method of operation of an integrated circuit including a shared redundancy storage location is shown in FIG. 3. An act 300 occurs for an array of memories that may be written to by an array of masters through a cross-bar switch. Act 300 comprises receiving at the cross-bar switch a plurality of write addresses and corresponding data words, each write address comprising a memory address identifying a corresponding memory in the array of memories and also comprising a storage address identifying a storage location within the corresponding memory. An example of act 300 is discussed above with regard to FIG. 1 concerning the receipt at the cross-bar switch 125 of the write addresses and corresponding data words from the masters 105 for writing to the corresponding storage locations in the addressed memories 110.

The flowchart also includes an act 305 of comparing each write address to a defective write address to determine whether the write address matches the defective address. The comparison of the write addresses by arbitration logic 120 of FIG. 1 is an example of act 305.

The flowchart also includes an act 310 of routing the storage addresses and the corresponding data words for those write addresses that do not match the defective address through the cross-bar switch to the corresponding memories. The routing of the data words through write multiplexers 140 to the addressed memories 110 as discussed with regard to FIG. 1 is an example of act 310.

Finally, the flowchart includes an act 315 of routing the corresponding data word for a write address that matches the defective address through the cross-bar switch to a shared redundancy storage element for the array of memories. The receipt of the data word that was otherwise bound for the defective address at repair register 115 of FIG. 1 is an example of act 315.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. For example, the shared redundancy storage location for the array of embedded memories need not comprise a register but may instead comprise other types of storage elements such as a latch or an SRAM. The arbitration logic circuit may comprise several logic circuits that word together to implement the disclosed arbitration logic function. For example, the arbitration logic circuit may comprise a conventional arbitration logic circuit configured to control the write multiplexers to perform conventional write operations to their corresponding memories and also a redundancy logic circuit. The redundancy logic circuit would then control the repair register's write multiplexer and all the read multiplexers. In that regard, the selection at the read multiplexers is unlike that at the write multiplexers in that each read multiplexer has the ability to select for the data output word from the repair registers. In contrast, the write multiplexers for the embedded memories may be completely agnostic to the redundancy features and instead operate in a conventional fashion.

In light of the numerous alternative embodiments, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An integrated circuit, comprising:
   an array of masters;
   an array of memories;
   a cross-bar switch;
   a shared redundancy storage element for the array of memories; and
   an arbitration logic circuit configured to compare write addresses from the masters to a defective write address to identify a matching one of the write addresses that matches the defective write address, wherein the arbitration logic circuit is further configured to control the cross-bar switch to route a data word corresponding to the matching write address to the shared redundancy storage element.

2. The integrated circuit of claim 1, wherein the cross-bar switch comprises a plurality of write multiplexers corresponding to the array of memories and a redundancy write multiplexer corresponding to the shared redundancy storage element.

3. The integrated circuit of claim 2, wherein each write address is associated with a corresponding data word, and wherein each write address comprises a memory address identifying a corresponding memory in the array of memories and a storage address identifying a storage location with the corresponding memory, and wherein the arbitration logic circuit is further configured to control the write multiplexers to route the storage addresses and the corresponding data words for the write addresses that do not match the defective write address to the corresponding memories.

4. The integrated circuit of claim 3, further comprising an array of registers configured to register the storage addresses and the corresponding data words at inputs to the write multiplexers.

5. The integrated circuit of claim 3, further comprising an array of registers configured to register the storage addresses and the corresponding data words at outputs of the write multiplexers.

6. The integrated circuit of claim 1, wherein each master comprises an arithmetic-logic unit.

7. The integrated circuit of claim 1, wherein each memory comprises an SRAM.

8. The integrated circuit of claim 1, wherein the shared redundancy storage element comprises a register.

9. The integrated circuit of claim 3, wherein the cross-bar switch further comprises an array of read multiplexers corresponding to the array of masters, each read multiplexer being configurable to select from data output words from the array of memories and from the shared redundancy storage element to provide a selected data output word to the corresponding master.

10. The integrated circuit of claim 9, wherein the arbitration logic circuit is configured to compare a plurality of read addresses from the masters to the defective write address to identify a read address from a given one of the masters that matches the defective write address and to identify read addresses from remaining ones of the masters that do not match the defective write address, and wherein the arbitration logic circuit is further configured to control the read multiplexer for the given one of the masters to select for the data output word from the shared redundancy storage location.

11. The integrated circuit of claim 10, wherein the arbitration logic circuit is further configured to control the read multiplexers for the remaining ones of the masters to select from the data output words from the array of memories.

12. The integrated circuit of claim 11, further comprising an array of registers corresponding to the array of memories, wherein each register is configured to register the corresponding memory's data output word prior to routing through the read multiplexers.

13. The integrated circuit of claim 3, wherein each storage address is a row address.

14. A method, comprising:
for an array of memories that may be written to by an array of masters through a cross-bar switch, receiving at the cross-bar switch a plurality of write addresses and corresponding data words, each write address comprising a memory address identifying a corresponding memory in the array of memories and also comprising a storage address identifying a storage location within the corresponding memory;
comparing each write address to a defective write address to determine whether the write address matches the defective write address; and
routing the corresponding data word for a write address that matches the defective write address through the cross-bar switch to a shared redundancy storage element for the array of memories.

15. The method of claim 14, further comprising:
routing the storage addresses and the corresponding data words for those write addresses that do not match the defective write address through the cross-bar switch to the corresponding memories.

16. The method of claim 14, further comprising:
receiving at the cross-bar switch a first read address from a first one of the masters, wherein the first read address does not match the defective write address; and
responsive to a determination that the first read address does not match the defective write address, routing a first data word identified by the first read address from a corresponding one of the memories through the cross-bar switch to the first one of the masters.

17. The method of claim 16, further comprising:
receiving at the cross-bar switch a second read address from a second one of the masters, wherein the second read address matches the defective write address; and
responsive to a determination that the second read address matches the defective write address, retrieving a second data word from the shared redundancy storage element and routing the retrieved second data word through the cross-bar switch to the second one of the masters.

18. The method of claim 16, wherein retrieving the second data word from the shared redundancy storage element comprises retrieving the second data word from a repair register.

19. The method of claim 18, wherein routing the second data word comprises routing the second data word through a read multiplexer having an output coupled to the second one of the masters.

20. The method of claim 14, wherein the storage address comprises a row address.

21. An integrated circuit, comprising:
a plurality of masters;
a plurality of memories;
means for coupling the masters to the plurality of memories so that each master can read from and write to selected ones of the memories;
a shared redundancy storage element for the plurality of memories; and
an arbitration logic circuit configured to compare write addresses from the masters to a defective address to identify a matching one of the write addresses that does match the defective write address, wherein the arbitration logic circuit is further configured to control the means to route a data word corresponding to the matching write address to the shared redundancy storage element.

22. The integrated circuit of claim 21, wherein each write address is associated with a corresponding data word, and wherein each write address comprises a memory address identifying a corresponding memory in the plurality of memories and a storage address identifying a storage location with the corresponding memory, and wherein the arbitration logic circuit is further configured to control the means to route the storage addresses and the corresponding data words for write addresses that do not match the defective write address to the corresponding memories.

23. The integrated circuit of claim 22, wherein each storage address comprises a row address.

24. The integrated circuit of claim 21, wherein each master comprises an arithmetic-logic unit.

25. The integrated circuit of claim 21, wherein each memory comprises an SRAM.

26. The integrated circuit of claim 21, wherein the shared redundancy storage element comprises a register.

27. The integrated circuit of claim 22, wherein the arbitration logic circuit is further configured to compare a plurality of read addresses from the masters to the defective write address to identify a read address from a given one of the masters that matches the defective write address and to identify read addresses from remaining ones of the masters that do not match the defective write address, and wherein the arbitration logic circuit is further configured to control the means to route for a data output word from the shared redundancy storage location to the given one of the masters.

* * * * *